(12) United States Patent
Katou et al.

(10) Patent No.: US 12,000,585 B2
(45) Date of Patent: Jun. 4, 2024

(54) LIGHTING DEVICE

(71) Applicant: KYOCERA Corporation, Kyoto (JP)

(72) Inventors: Hidetaka Katou, Omihachiman (JP);
Tamio Kusano, Higashiomi (JP); Kohei Ikeda, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 247 days.

(21) Appl. No.: 17/632,898

(22) PCT Filed: Aug. 6, 2020

(86) PCT No.: PCT/JP2020/030205
§ 371 (c)(1),
(2) Date: Feb. 4, 2022

(87) PCT Pub. No.: WO2021/025120
PCT Pub. Date: Feb. 11, 2021

(65) Prior Publication Data
US 2022/0268423 A1 Aug. 25, 2022

(30) Foreign Application Priority Data

Aug. 7, 2019 (JP) .................................. 2019-145471
Dec. 16, 2019 (JP) .................................. 2019-226564

(51) Int. Cl.
*F21V 9/32* (2018.01)
*F21V 23/00* (2015.01)
*F21Y 113/10* (2016.01)

(52) U.S. Cl.
CPC .............. *F21V 9/32* (2018.02); *F21V 23/003* (2013.01); *F21Y 2113/10* (2016.08)

(58) Field of Classification Search
CPC .................................. F21V 9/32; F21V 23/003
See application file for complete search history.

(56) References Cited

U.S. PATENT DOCUMENTS 7,404,652 B2 7/2008 Ng et al.
8,459,855 B2 * 6/2013 Anandan ........... G02F 1/133605
362/613

(Continued)

FOREIGN PATENT DOCUMENTS

CN 1790708 A 6/2006
CN 104718633 A 6/2015

(Continued)

*Primary Examiner* — Bryon T Gyllstrom
(74) *Attorney, Agent, or Firm* — Volpe Koenig

(57) ABSTRACT

A lighting device includes a first light-emitting device, a plurality of second light-emitting devices, and a control unit. The first light-emitting device has a first emission spectrum that has a first peak wavelength in a wavelength range from 360 nm to 430 nm and in which a light intensity continuously decreases with decreasing wavelength from the first peak wavelength and with increasing wavelength from the first peak wavelength. Each of the plurality of second light-emitting devices has a second emission spectrum with a second peak wavelength in the range from 360 nm to 430 nm, that has a third peak wavelength in a range from the second peak wavelength to 750 nm, and in which a light intensity continuously decreases with decreasing wavelength from the second peak wavelength and with increasing wavelength from the third peak wavelength. The control unit controls all of the light-emitting devices.

17 Claims, 9 Drawing Sheets

(56) References Cited

U.S. PATENT DOCUMENTS

| | | | | |
|---|---|---|---|---|
| 8,469,547 B2* | 6/2013 | Paolini | ............... | G01J 3/2803 |
| | | | | 362/249.02 |
| 8,511,851 B2* | 8/2013 | Van de Ven | ........... | H05B 45/20 |
| | | | | 362/230 |
| 8,740,400 B2* | 6/2014 | Tao | ............... | C09K 11/77344 |
| | | | | 362/293 |
| 8,928,249 B2* | 1/2015 | Raj | ............... | H05B 45/22 |
| | | | | 315/153 |
| 10,090,442 B2 | 10/2018 | Peeters et al. | | |
| 10,208,943 B2* | 2/2019 | Allen | ............... | F21V 19/0015 |
| 2007/0291467 A1* | 12/2007 | Nagai | ............... | H05B 45/20 |
| | | | | 362/231 |
| 2008/0106887 A1* | 5/2008 | Salsbury | ............... | F21K 9/64 |
| | | | | 362/231 |
| 2008/0278927 A1* | 11/2008 | Li | ............... | H05B 45/20 |
| | | | | 362/84 |
| 2013/0082289 A1 | 4/2013 | Sakuta et al. | | |
| 2014/0210368 A1 | 7/2014 | Lee et al. | | |
| 2016/0025294 A1* | 1/2016 | Dijken | ............... | F21V 9/32 |
| | | | | 264/400 |
| 2018/0274754 A1 | 9/2018 | Kusano et al. | | |

FOREIGN PATENT DOCUMENTS

| | | |
|---|---|---|
| EP | 2905818 B1 | 12/2023 |
| JP | 2010-182724 A | 8/2010 |
| JP | 2013-012778 A | 1/2013 |
| JP | 2015-126160 A | 7/2015 |
| JP | 2017-136396 A | 8/2017 |
| JP | 6363061 B2 | 7/2018 |

* cited by examiner

LIGHTING DEVICE

TECHNICAL FIELD

The present disclosure relates to a lighting device.

BACKGROUND ART

In recent years, lighting devices including semiconductor light-emitting elements, such as light emitting diodes (LEDs), as light sources have been used in place of fluorescent lamps and light bulbs. In addition, lighting devices including light-emitting elements as light sources have also been used as light sources for appearance inspection of coated surfaces of, for example, household appliances and passenger automobiles.

The semiconductor light-emitting elements emit light in a narrow wavelength band, and can only emit light of one color. When white light is to be obtained as illumination light, a plurality of semiconductor light-emitting elements that emit light in different wavelength bands are prepared, and colors of a plurality of light rays that are emitted are mixed to obtain white light. Alternatively, a plurality of phosphors that emit fluorescent light in different wavelength bands in response to excitation light of a single wavelength are prepared, and colors of light emitted from a semiconductor light-emitting element and a plurality of fluorescent light rays generated as a result of excitation by the light emitted from the semiconductor light-emitting element are mixed to obtain white light. The above-described color mixing method enables production of not only white light but also a light source having a spectrum suitable for its use (see Japanese Unexamined Patent Application Publication No. 2015-126160).

However, according to the technology disclosed in Patent Literature 1, control of the emission intensity and emission spectrum of a lighting device is neither described nor suggested.

SUMMARY OF INVENTION

A lighting device according to an embodiment of the present disclosure includes a first light-emitting device, a plurality of second light-emitting devices, and a control unit. The first light-emitting device has a first emission spectrum that has a first peak wavelength in a wavelength range from 360 nm to 430 nm and in which a light intensity continuously decreases with decreasing wavelength from the first peak wavelength and with increasing wavelength from the first peak wavelength. Each of the plurality of second light-emitting devices has a second emission spectrum that has a second peak wavelength in the wavelength range from 360 nm to 430 nm, that has a third peak wavelength in a wavelength range from the second peak wavelength to 750 nm, and in which a light intensity continuously decreases with decreasing wavelength from the second peak wavelength and with increasing wavelength from the third peak wavelength. The control unit controls the first light-emitting device and the plurality of second light-emitting devices. The third peak wavelengths of the plurality of second light-emitting devices differ from each other.

A lighting device according to another embodiment of the present disclosure has an emission spectrum having an excitation peak wavelength in a wavelength range from 360 nm to 430 nm and an emission peak wavelength in a wavelength range from 610 nm to 730 nm. Assuming that a light intensity at the emission peak wavelength is 1, a relative light intensity is in a range from 0.05 to 0.3 at the excitation peak wavelength and is 0.1 or less in a range from 440 nm to 480 nm, and the light intensity continuously increases in a wavelength range from 480 nm to the emission peak wavelength.

DESCRIPTION OF EMBODIMENTS

Light-emitting devices and lighting devices according to embodiments of the present disclosure will now be described with reference to the drawings.

<Configuration of Light-Emitting Device and Lighting Device>

Figure 1:
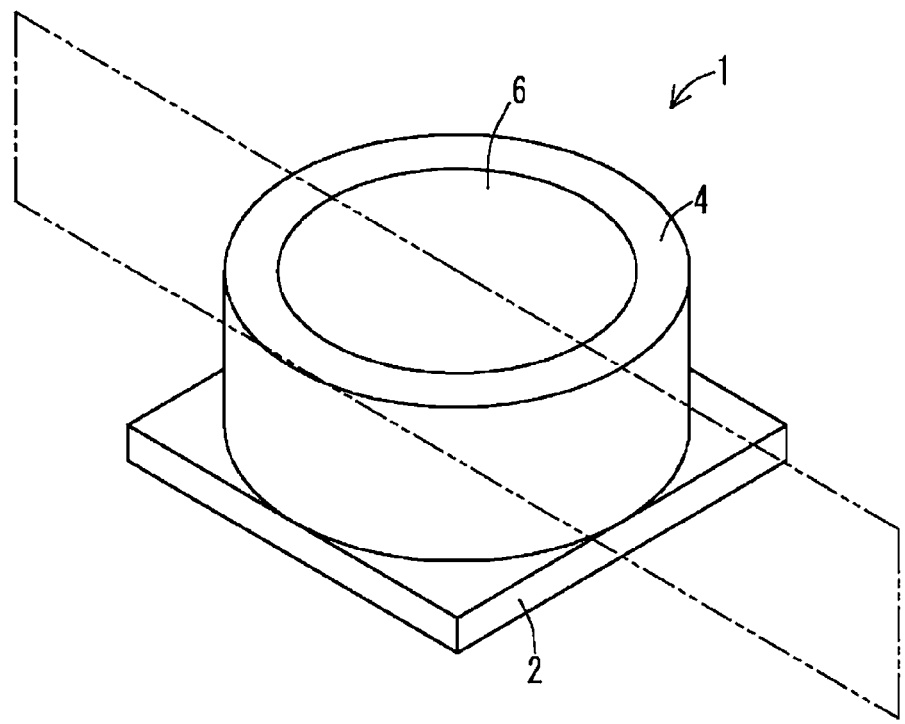
FIG. 1 is an external perspective view of a light-emitting device according to an embodiment of the present disclosure.
Figure 2:
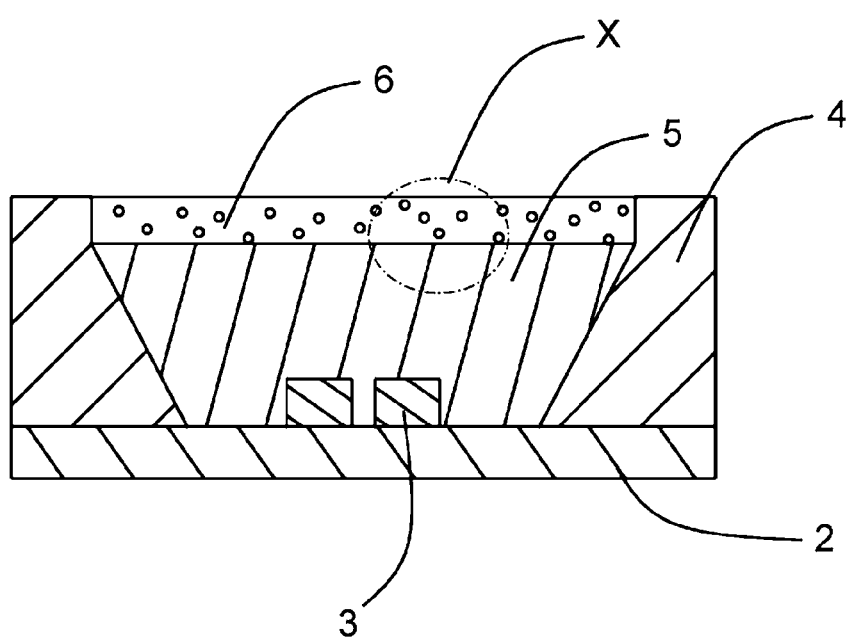
FIG. 2 is a sectional view of the light-emitting device illustrated in FIG. 1 taken along a plane shown by the imaginary lines.
Figure 3:
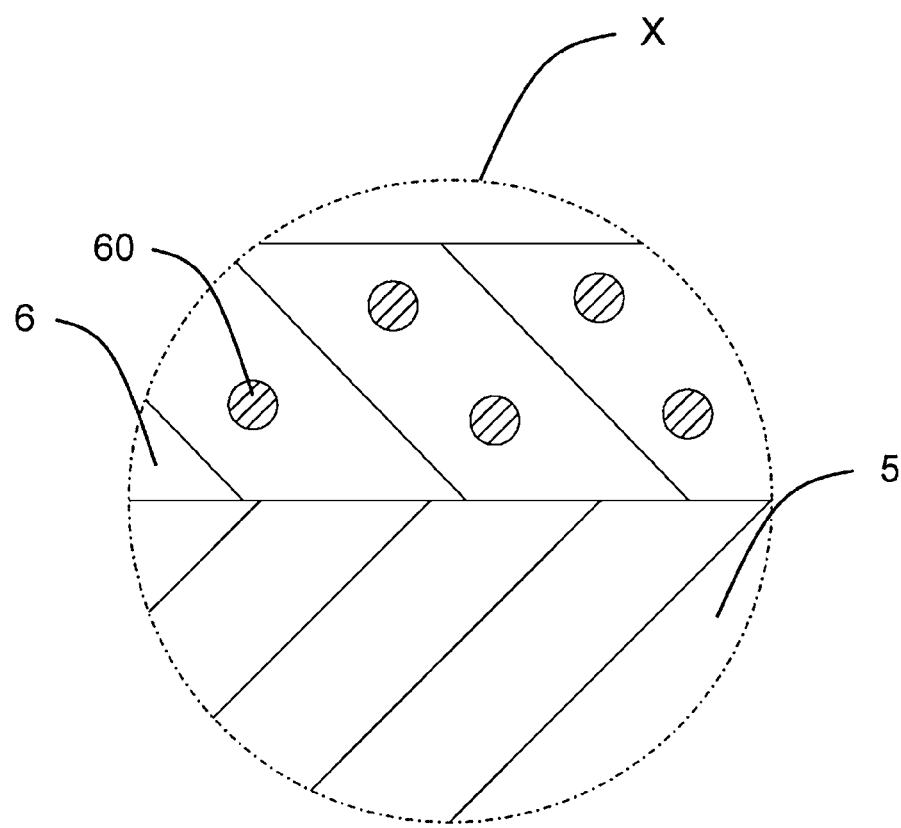
FIG. 3 is an enlarged view of the light-emitting device illustrated in FIG. 2.
Figure 12:
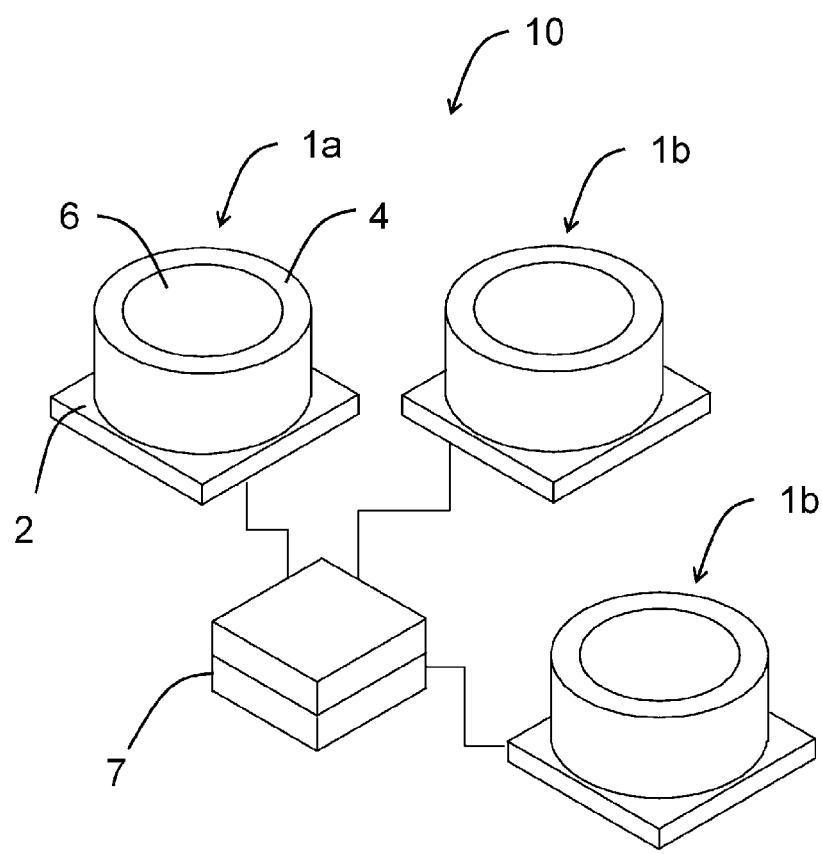
FIG. 12 is a diagram illustrating the configuration of the lighting device according to the embodiment of the present disclosure.

FIG. 1 is an external perspective view of a light-emitting device according to an embodiment of the present disclosure. FIG. 2 is a sectional view of the light-emitting device illustrated in FIG. 1 taken along a plane shown by the imaginary lines. FIG. 12 is a diagram illustrating the configuration of a lighting device according to the embodiment of the present disclosure. Referring to these figures, a lighting device 10 includes a first light-emitting device 1a, a plurality of second light-emitting devices 1b, and a control unit 7. The first light-emitting device 1a and the second light-emitting devices 1b each include a substrate 2, light-emitting elements 3, a frame 4, and a sealing member 5. The lighting device 10 includes the first light-emitting device 1a, the second light-emitting devices 1b, and the control unit 7. The second light-emitting devices 1b each include the substrate 2, the light-emitting elements 3, the frame 4, the sealing member 5, and a wavelength converting member 6.

The light-emitting elements 3 are disposed on the substrate 2. The frame 4 is disposed on the substrate 2 and surrounds the light-emitting elements 3. The sealing member 5 fills a portion of the space surrounded by the frame 4 excluding an upper portion of the space surrounded by the frame 4. The wavelength converting member 6 is disposed in the upper portion of the space surrounded by the frame 4 and fitted to the frame 4 so as to extend along the upper surface of the sealing member 5. Each light-emitting element 3 is, for example, a light emitting diode (LED) or a laser diode (LD) that emits light toward the outside by causing recombination of electrons and positive holes in a pn junction of a semiconductor.

The substrate 2 is a substrate made mainly of an insulating material, and the insulating material may be, for example, a ceramic material, such as alumina or mullite, or a glass ceramic material. Alternatively, the insulating material may be a composite material obtained by mixing more than one of the above-mentioned materials. The substrate 2 may also be made of a polymeric resin in which fine metal oxide particles that enable adjustment of thermal expansion of the substrate 2 are dispersed.

A wiring conductor that provides internal and external electrical connection for the substrate 2 is provided at least on the upper surface of the substrate 2 or inside the substrate 2. The wiring conductor is made of, for example, a conductive material, such as tungsten, molybdenum, manganese, or copper. When the substrate 2 is made of a ceramic material, for example, metal paste obtained by adding an organic solvent to powder of, for example, tungsten is printed on a ceramic green sheet used to form the substrate 2 in a predetermined pattern. Then, a plurality of ceramic green sheets are stacked together and fired to form the substrate 2. The wiring conductor has a plating layer made of, for example, nickel or gold on a surface thereof to prevent oxidation. To effectively reflect light upward from the substrate 2, a metal reflection layer may be provided on the upper surface of the substrate 2 so as to be spaced from the wiring conductor and the plating layer. The metal reflection layer may be made of, for example, aluminum, silver, gold, copper, or platinum.

The light-emitting elements 3 are mounted on a principal surface of the substrate 2. The light-emitting elements 3 are electrically connected to the plating layer that covers the surface of the wiring conductor formed on the upper surface of the substrate 2 with, for example, a brazing material or solder. The light-emitting elements 3 each include a light transmissive base and an optical semiconductor layer formed on the light transmissive base. There are no limitations to the light transmissive base as long as the optical semiconductor layer can be grown on the light transmissive base by a chemical vapor deposition method, such as a metal-organic chemical vapor deposition method or a molecular beam epitaxial deposition method. The material of the light transmissive base may be, for example, sapphire, gallium nitride, aluminum nitride, zinc oxide, zinc selenide, silicon carbide, silicon, or zirconium diboride. The light transmissive base has a thickness of, for example, 50 μm or more and 1000 μm or less.

The optical semiconductor layer includes a first semiconductor layer formed on the light transmissive base, a light-emitting layer formed on the first semiconductor layer, and a second semiconductor layer formed on the light-emitting layer. The first semiconductor layer, the light-emitting layer, and the second semiconductor layer may be made of, for example, a Group III nitride semiconductor, a Group III-V semiconductor, such as gallium phosphide or gallium arsenide, or a Group III nitride semiconductor, such as gallium nitride, aluminum nitride, or indium nitride. The first semiconductor layer has a thickness of, for example, 1 μm or more and 5 μm or less. The light-emitting layer has a thickness of, for example, 25 nm or more and 150 nm or less. The second semiconductor layer has a thickness of, for example, 50 nm or more and 600 nm or less. The light-emitting elements 3 having the above-described structure are capable of emitting excitation light in a wavelength range of, for example, 280 nm or more and 450 nm or less.

The frame 4 is made of, for example, a ceramic material, such as aluminum oxide, titanium oxide, zirconium oxide, or yttrium oxide; a porous material; or a resin material mixed with powder of metal oxide, such as aluminum oxide, titanium oxide, zirconium oxide, or yttrium oxide. The frame 4 is joined to the principal surface of the substrate 2 with, for example, a resin, a brazing material, or solder. The frame 4 is provided on the principal surface of the substrate 2 so as to surround the light-emitting elements 3 with an interval provided between the frame 4 and the light-emitting elements 3. The frame 4 is formed such that an inner wall surface thereof is inclined to spread outward with increasing distance from the principal surface of the substrate 2. The inner wall surface of the frame 4 functions as a reflective surface that reflects the excitation light emitted from the light-emitting elements 3. When the inner wall surface of the frame 4 has a circular shape in plan view, the light emitted from the light-emitting elements 3 can be uniformly reflected outward by the reflective surface.

The inclined inner wall surface of the frame 4 may have, for example, a metal layer and a plating layer formed on an inner peripheral surface of the frame 4, which is made of a sintered material. The metal layer is made of, for example, tungsten, molybdenum, or manganese. The plating layer covers the metal layer, and is made of nickel or gold. The plating layer has a function of reflecting the light emitted from the light-emitting elements 3. The inclination angle of the inner wall surface of the frame 4 is set to an angle in the range of, for example, 55 degrees or more and 70 degrees or less with respect to the principal surface of the substrate 2.

The space surrounded by the substrate 2 and the frame 4 is filled with the sealing member 5 that transmits light. The sealing member 5 seals the light-emitting elements 3 and allows the light emitted from the inside of the light-emitting elements 3 to be extracted to the outside. The sealing member 5 also has a function of transmitting the light extracted to the outside of the light-emitting elements 3. The sealing member 5 fills a portion of the space surrounded by the substrate 2 and the frame 4 excluding a portion of the space surrounded by the frame 4. The sealing member 5 is made of, for example, a light transmissive insulating resin, such as a silicone resin, an acrylic resin, or an epoxy resin, or a light transmissive glass material. The sealing member 5 has a refractive index set in the range of, for example, 1.4 or more and 1.6 or less.

The wavelength converting member 6 is disposed in the upper portion of the space surrounded by the substrate 2 and the frame 4 so as to extend along the upper surface of the sealing member 5. The wavelength converting member 6 is formed to be disposed inside the frame 4. The wavelength converting member 6 has a function of converting the wavelength of the light emitted by the light-emitting elements 3. More specifically, the light emitted from the light-emitting elements 3 passes through the sealing member 5 and enters the wavelength converting member 6. At this time, phosphors contained in the wavelength converting member 6 are excited by the light emitted from the light-emitting elements 3, so that fluorescent light is emitted from the phosphors. The wavelength converting member 6 also allows part of the light emitted from the light-emitting elements 3 to transmit therethrough. The wavelength converting member 6 is made of, for example, a light-transmissive insulating resin, such as a fluorocarbon resin, a silicone resin, an acrylic resin, or an epoxy resin, or a light transmissive glass material, and the phosphors are contained in the insulating resin or the glass material. The phosphors are uniformly dispersed in the wavelength converting member 6. The light-emitting elements 3 and the phosphors contained in the wavelength converting member 6 are selected so that the light-emitting device 1 emits light having an emission spectrum illustrated in FIG. 4.

Figure 5:
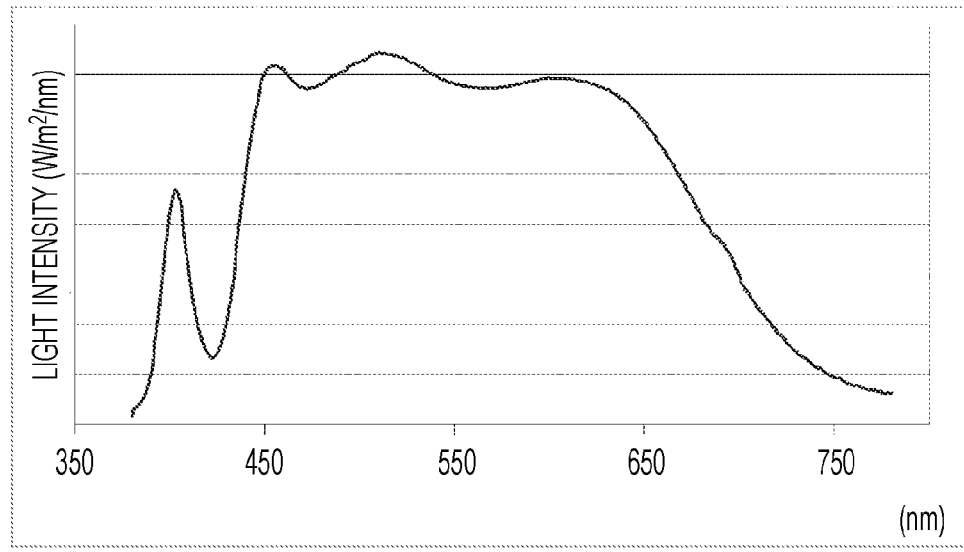
FIG. 5 is a graph showing a spectrum of light emitted to the outside from a lighting device according to the embodiment of the present disclosure.

Referring to FIG. 5, according to the embodiment of the present disclosure, the light-emitting elements 3 included in the first light-emitting device 1a have a first peak wavelength λ1 in the range from 360 nm to 430 nm. In addition, the light-emitting elements 3 included in each second light-emitting device 1b emit excitation light having a second peak wavelength λ2 in the range from 360 nm to 430 nm. Thus, the second peak wavelength λ2 is a peak wavelength of the excitation light. Each second light-emitting device 1b may also have a third peak wavelength λ3, which is obtained when the phosphors are irradiated with the excitation light, in a wavelength range from the second peak wavelength λ2 to 750 nm. For example, the third peak wavelength λ3 may be in a wavelength range from 410 nm to 750 nm. The second light-emitting devices 1b include phosphors that are at least partially different from each other. Phosphors that emit blue fluorescent light, phosphors that emit blue-green fluorescent light, phosphors that emit green fluorescent light, phosphors that emit red fluorescent light, and phosphors that emit near infrared fluorescent light may be additionally used. Mixtures of these phosphors may also be used.

Examples of the phosphors will now be described. The phosphors that show a blue color may be $BaMgAl_{10}O_{17}$:Eu, $(Sr,Ca,Ba)_{10}(PO_4)_6Cl_2$:Eu, or $(Sr,Ba)_{10}(PO_4)_6Cl_2$:Eu. The phosphors that show a blue-green color may be $(Sr,Ba,Ca)_5(PO_4)_3Cl$:Eu or $Sr_4Al_{14}O_{25}$:Eu. The phosphors that show a green color may be $SrSi_2(O,Cl)_2N_2$:Eu, $(Sr,Ba,Mg)_2SiO_4$:$Eu^{2+}$, ZnS:Cu,Al, or $Zn_2SiO_4$:Mn. The phosphors that show a red color may be $Y_2O_2S$:Eu, $Y_2O_3$:Eu, $SrCaClAlSiN_3$:$Eu^{2+}$, $CaAlSiN_3$:Eu, or $CaAlSi(ON)_3$:Eu. The phosphors that show a color in a near infrared region may be $3Ga_5O_{12}$:Cr.

Figure 13:
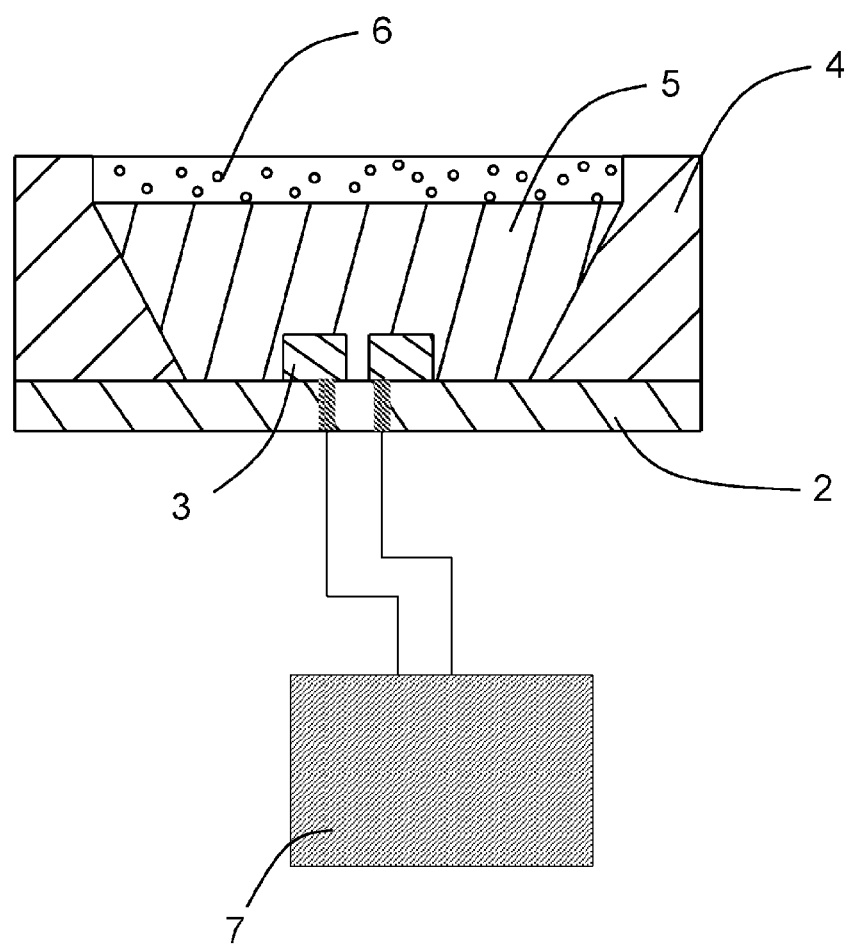
FIG. 13 is a sectional view illustrating the configuration of a lighting device according to another embodiment of the present disclosure.

As illustrated in FIGS. 12 and 13, the lighting device 10 according to the embodiment of the present disclosure includes the above-described first light-emitting device 1a, the second light-emitting devices 1b, and the control unit 7. The lighting device 10 will now be described with reference to the drawings. In the lighting device 10, an emission spectrum of light emitted form the first light-emitting device 1a is defined as a first emission spectrum, and emission spectrums of light emitted from the second light-emitting devices 1b are defined as second emission spectrums. The control unit 7 controls the first light-emitting device 1a and the second light-emitting devices 1b. An emission spectrum of light obtained by combining the first emission spectrum and the second emission spectrums that are controlled by the control unit 7, that is, an emission spectrum of light emitted from the lighting device 10, is defined as a third emission spectrum.

The control unit 7 controls a light control ratio for each light-emitting device. The light control ratio represents electric power applied to each light-emitting device, that is, a ratio of a voltage value and/or a current value with reference to the rated current value and/or the rated voltage value. When PWM control is used, the light control ratio is a duty ratio of the voltage and/or current. Thus, the flux of light emitted from each light-emitting device can be adjusted.

For example, the control unit 7 can adjust the emission intensity of light emitted from the first light-emitting device 1a and/or the second light-emitting devices 1b. The emission intensity (light intensity) is the illuminance of light incident on a light sensitive surface, that is, an incident light flux per unit area. Assuming that the maximum light intensity is 1, the emission intensity of each light-emitting device is adjustable to any value in the range from 0 to 1. By adjusting the ratio of the intensity of light emitted from each light-emitting device in steps of 0.1 or 0.01, for example, light in various colors can be emitted. When the first light-emitting device 1a and the second light-emitting devices 1b each include a plurality of light-emitting elements, as illustrated in FIG. 13, a circuit of each light-emitting device 1 may be adjusted to control which of the light-emitting elements is to receive a voltage and the amount of voltage or current to be applied.

When the lighting device 10 includes the first light-emitting device 1a and the second light-emitting devices 1b which each have the second peak wavelength λ2, as illustrated in FIG. 12, it is also possible to control, for example, which of the light-emitting devices are to be caused to emit light or which of the light-emitting devices are to be caused to emit light at increased emission intensities. More specifically, the third emission spectrum of the lighting device 10 is a combination of the first emission spectrum, which is the spectrum of light emitted from the first light-emitting device 1a, and the second emission spectrums, which are the spectrums of light emitted from the second light-emitting devices 1b. The intensity of the first emission spectrum can be adjusted by adjusting the voltage or current applied to the first light-emitting device 1a, and the intensities of the second emission spectrums can be adjusted by adjusting the voltage or current applied to each second light-emitting device 1b. The emission spectrum of light emitted from the lighting device 10 under the above-described control is the third emission spectrum. The control unit 7 controls which of the light-emitting devices are to be selected.

More specifically, the control unit 7 may select the first light-emitting device 1a as a light-emitting device to be caused to emit light and control which of the second light-emitting devices 1b is to be caused to emit light based on the first emission spectrum. Also, the control unit 7 may select a light-emitting device that serves as a reference for controlling the light control ratio from the first light-emitting device 1a and the second light-emitting devices 1b and control the light control ratio for each light-emitting device based on the light control ratio of the light-emitting device that serves as a reference. For example, the control unit 7 may set a first light control ratio for the first light-emitting device 1a and control the light control ratio for each of the second light-emitting devices 1b based on the first light control ratio. Alternatively, the control unit 7 may select one of the second light-emitting devices 1b that has a peak wavelength, at which the light intensity is at a maximum, in the wavelength range from the second peak wavelength $\lambda 2$ to 750 nm, and set a second light control ratio for the selected second light-emitting device $1b$. Then, the control unit 7 may control the light control ratio for each of the first light-emitting device $1a$ and the other second light-emitting devices $1b$ based on the second light control ratio.

The control unit 7 may control the first light-emitting device $1a$ and/or the second light-emitting devices $1b$ based on signals or information received from the outside via, for example, wireless communication. The control unit 7 may include a computing device, such as a CPU, and a memory.

The lighting device 10 according to the embodiment of the present disclosure includes the first light-emitting device $1a$, the second light-emitting devices $1b$, and the control unit 7. The first light-emitting device $1a$ has the first emission spectrum that has the first peak wavelength $\lambda 1$ in the wavelength range from 360 nm to 430 nm and in which the light intensity continuously decreases with decreasing wavelength from the first peak wavelength and with increasing wavelength from the first peak wavelength in the range from 360 nm to 750 nm. The expression "light intensity continuously decreases" means that the emission spectrum has no local maximum values in a section of the wavelength range in which the light intensity decreases. In a measured emission spectrum, small crests and troughs that correspond to measurement errors are not regarded as defining peak wavelengths.

Each of the second light-emitting devices $1b$ has a second emission spectrum that has the second peak wavelength $\lambda 2$ in the wavelength range from 360 nm to 430 nm and the third peak wavelength $\lambda 3$ in the wavelength range from the second peak wavelength $\lambda 2$ to 750 nm, and in which the light intensity continuously deceases with decreasing wavelength from the second peak wavelength $\lambda 2$ and with increasing wavelength from the third peak wavelength $\lambda 3$. The lighting device 10 includes the plurality of second light-emitting devices $1b$. The second light-emitting devices $1b$ preferably have different third peak wavelengths $\lambda 3$ at least in a wavelength range from 430 nm to 750 nm.

As described above, the control unit 7 is capable of selecting light-emitting devices to be caused to emit light from the first light-emitting device $1a$ and the second light-emitting devices $1b$. The control unit 7 is also capable of controlling the light control ratio of each of the first light-emitting device $1a$ and the second light-emitting devices $1b$. In other words, the control unit 7 is capable of controlling the third emission spectrum of the lighting device 10 by controlling which of the light-emitting devices are to be caused to emit light and brightness of the light emitted by each of the light-emitting devices. Thus, the light-emitting devices having spectrums with different peak wavelengths can be individually controlled. Therefore, the third emission spectrum may be variously changed depending on the use.

The second light-emitting devices $1b$ may have different third peak wavelengths $\lambda 3$, and the half-width thereof at the third peak wavelengths $\lambda 3$ may increase with increasing wavelength. To reproduce visible light, such as light with the spectrum of sunlight, the light needs to be reproduced over a wavelength range including long wavelengths. Therefore, when the half-width increases with increasing wavelength, light control can be facilitated. In this case, the third peak wavelengths $\lambda 3$ of the second light-emitting devices $1b$ may differ from each other by at least 10 nm or more. In a lighting device having emission spectrums with different peak wavelengths, light with a broader wavelength range can be emitted as the wavelength ranges in which the emission spectrums overlap are reduced.

When the light control ratio of the first light-emitting device $1a$ is equal to the light control ratio of at least one of the second light-emitting devices $1b$, the light intensity at the second peak wavelength $\lambda 2$ of this second light-emitting device $1b$ may be 25% or less of the light intensity at the first peak wavelength $\lambda 1$. Namely, when the light control ratio of the first light-emitting device $1a$ is equal to the light control ratio of the second light-emitting devices $1b$, the first light-emitting device $1a$ may have the highest light intensity in the range from 360 nm to 430 nm. In such a case, when the peak wavelengths of the excitation light of the second light-emitting devices $1b$ (second peak wavelengths $\lambda 2$) overlap the first peak wavelength $\lambda 1$, the influence of the second peak wavelengths $\lambda 2$ can be reduced. Therefore, control of light in the range from 360 nm to 430 nm, which corresponds to a violet region, can be facilitated.

The third emission spectrum may have peak wavelengths at the first peak wavelength $\lambda 1$, the second peak wavelengths $\lambda 2$, and the third peak wavelengths $\lambda 3$. The emission spectrum of the lighting device 10 is an emission spectrum of light obtained by combining light rays emitted from the first light-emitting device $1a$ and the second light-emitting devices $1b$. Therefore, the magnitude of light intensity, for example, varies depending on the light control ratios of the light-emitting devices. As the differences between the third peak wavelengths $\lambda 3$ of the second light-emitting devices $1b$ increase, the degree of overlap between the light rays at the peak wavelengths decreases, and the peak positions become more distinct. In such a configuration, the third emission spectrum of the light emitted from the lighting device 10 has peak wavelengths that are equal to the third peak wavelengths $\lambda 3$ of the second light-emitting devices $1b$. Here, assuming that two of the third peak wavelengths $\lambda 3$ overlap, it can be said that the degree of overlap is small when the light intensity at the wavelength of the boundary of overlap is less than 50% of the greater one of the light intensities at the two third peak wavelengths $\lambda 3$. In such a case, the third emission spectrum has peaks at the wavelengths equal to the third peak wavelengths $\lambda 3$ of the second light-emitting devices $1b$. When the control unit 7 selects the second light-emitting devices $1b$ as described above, the lighting device 10 can easily adjust reproduction of light with the third emission spectrum having peak wavelengths at the peak wavelengths of the light-emitting devices.

Alternatively, the third emission spectrum may have peak wavelengths at the first peak wavelength $\lambda 1$ and the second peak wavelengths $\lambda 2$ and in a wavelength range between two of the third peak wavelengths $\lambda 3$. As the differences between the third peak wavelengths $\lambda 3$ of the second light-emitting devices $1b$ decrease, the degree of overlap between light rays around the third peak wavelengths $\lambda 3$ increase. Accordingly, the third emission spectrum has a peak at a wavelength at which the degree of overlap between the light rays is at a maximum. In this case, the second emission spectrums overlap. Here, assuming that two of the third peak wavelengths $\lambda 3$ overlap, it can be said that the second emission spectrums overlap when the light intensity at the wavelength of the boundary of overlap is 50% or more of the greater one of the light intensities at the two third peak wavelengths $\lambda 3$. In such a case, the third emission spectrum has a peak at a wavelength between the third peak wavelengths $\lambda 3$ of the second light-emitting devices $1b$. When the control unit 7 selects the second light-emitting devices $1b$ as described above, the lighting device 10 can easily adjust reproduction of light with the third emission spectrum having a peak wavelength that differs from the peak wavelengths of the light-emitting devices.

The first peak wavelength λ1 and the second peak wavelengths λ2 may be either the same peak wavelength or different peak wavelengths. In addition, the second peak wavelengths λ2 of the second light-emitting devices 1b, that is, the wavelengths of the excitation light, may be either the same peak wavelength or different peak wavelengths. The expression "the same peak wavelength" means that the differences between the peak wavelengths are less than 2 nm. This means that wavelength errors caused when the light-emitting elements are set to have the same peak wavelength are less than 2 nm. When the first peak wavelength λ1 and the second peak wavelengths λ2 are the same peak wavelength, color unevenness and color variations of the light emitted from the lighting device can be reduced because the peak wavelengths are the same. In this case, half-widths at the second peak wavelengths λ2 of the second light-emitting devices 1b may be the same. When the half-widths at the second peak wavelengths λ2 are the same, color unevenness in the wavelength range of the excitation light can be reduced.

Figure 4:
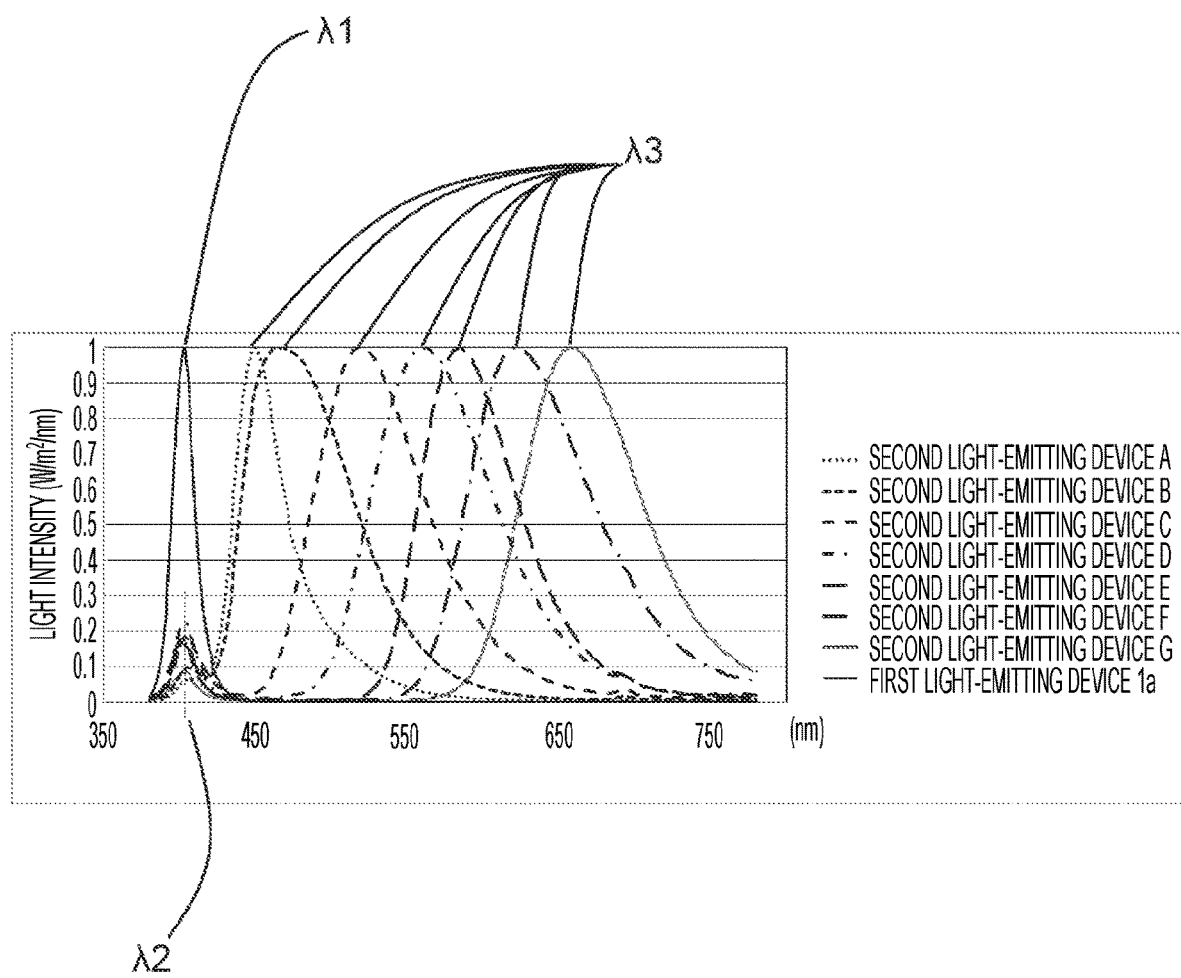
FIG. 4 is a graph showing emission spectrums of light-emitting devices according to the embodiment of the present disclosure.

FIG. 4 shows the emission spectrums in an example in which the lighting device 10 includes the first light-emitting device 1a and seven types of second light-emitting devices 1b and in which the light control ratio is 100% for each light-emitting device. For example, the first light-emitting device 1a emits light having the first peak wavelength in a wavelength range from 360 nm to 430 nm. The second light-emitting devices 1b include light-emitting elements that emit light having the second peak wavelengths in the range from 360 nm to 430 nm, and the emitted light serves as excitation light with which the phosphors are irradiated so that light having the third peak wavelengths is emitted. Assume that, for example, the second light-emitting devices 1b include a second light-emitting device A having the third peak wavelength λ3 in a wavelength range from the second peak wavelength λ2 to 480 nm; a second light-emitting device B having the third peak wavelength λ3 in a wavelength range from 440 nm to 520 nm; a second light-emitting device C having the third peak wavelength λ3 in a wavelength range from 480 nm to 570 nm; a second light-emitting device D having the third peak wavelength λ3 in a wavelength range from 520 nm to 620 nm; a second light-emitting device E having the third peak wavelength λ3 in a wavelength range from 550 nm to 650 nm; a second light-emitting device F having the third peak wavelength λ3 in a wavelength range from 580 nm to 690 nm; and a second light-emitting device G having the third peak wavelength λ3 in a wavelength range from 620 nm to 730 nm.

FIG. 5 shows a spectrum obtained when the light control ratio of the first light-emitting device 1a is 2%, the light control ratio of the second light-emitting device A is 10%, the light control ratio of the second light-emitting device B is 25%, the light control ratio of the second light-emitting device C is 30%, the light control ratio of the second light-emitting device D is 20%, the light control ratio of the second light-emitting device E is 10%, the light control ratio of the second light-emitting device F is 25%, and the light control ratio of the second light-emitting device G is 20%. In this case, the spectrum is close to D50, which is a reference spectrum corresponding to daytime sunlight. When the light control ratio of the first light-emitting device 1a is 2%, the light control ratio of the second light-emitting device A is 80%, the light control ratio of the second light-emitting device B is 40%, the light control ratio of the second light-emitting device C is 20%, the light control ratio of the second light-emitting device D is 5%, the light control ratio of the second light-emitting device E is 5%, the light control ratio of the second light-emitting device F is 0% (off), and the light control ratio of the second light-emitting device G is 0% (off), a spectrum close to that of blue light can be obtained. Thus, the spectrum may be brought closer to a spectrum of sunlight in the water.

According to the above-described configuration, light of various colors can be emitted by controlling the light control ratios of the second light-emitting devices 1b.

The light-emitting devices 1 according to the embodiment of the present disclosure may be used to emit light having a good color rendering property with a spectrum approximate to the spectrum of sunlight by adjusting the light control ratios of the light-emitting devices. In other words, the difference in light intensity between the spectrum of sunlight and the third emission spectrum of the lighting device 10 according to the embodiment of the present disclosure can be reduced, and the lighting device 10 capable of emitting light with a spectrum approximate to the spectrum of sunlight can be produced.

The lighting device 10 according to the embodiment of the present disclosure may be used to provide indoor illumination in, for example a building or a house, and may include one or more sets of light-emitting devices, each set including the first light-emitting device 1a and the plurality of second light-emitting devices 1b. When, for example, the lighting device is applied to a living space, an indoor lighting environment in which it seems as if sunlight is present can be created. When the lighting device is used for appearance inspection of a coated object, such as a passenger automobile, an indoor inspection environment in which it seems as if the object is illuminated with sunlight can be created. Since the object placed indoors can be irradiated with light having a spectrum close to that of sunlight, the object can be presented in a color close to that in sunlight (color rendering property can be improved), and color inspection can be performed more accurately in an environment closer to an environment in which the object is used.

According to the present disclosure, when the emitted light is controlled so that light close to sunlight is emitted, the emitted light may be controlled to change continuously from morning sunlight to evening sunlight. When the emitted light changes continuously from morning sunlight to evening sunlight, the emitted light is in harmony with the human circadian rhythm. In such a case, morning sunlight may be reproduced by increasing the light control ratio of light in a blue region so that light with a high color temperature is emitted. Also, evening sunlight may be reproduced by increasing the light control ratio of light in a red region so that light with a low color temperature is emitted. The light control ratio may also be adjusted so that an average color rendering index Ra is 85 or more.

Figure 6:
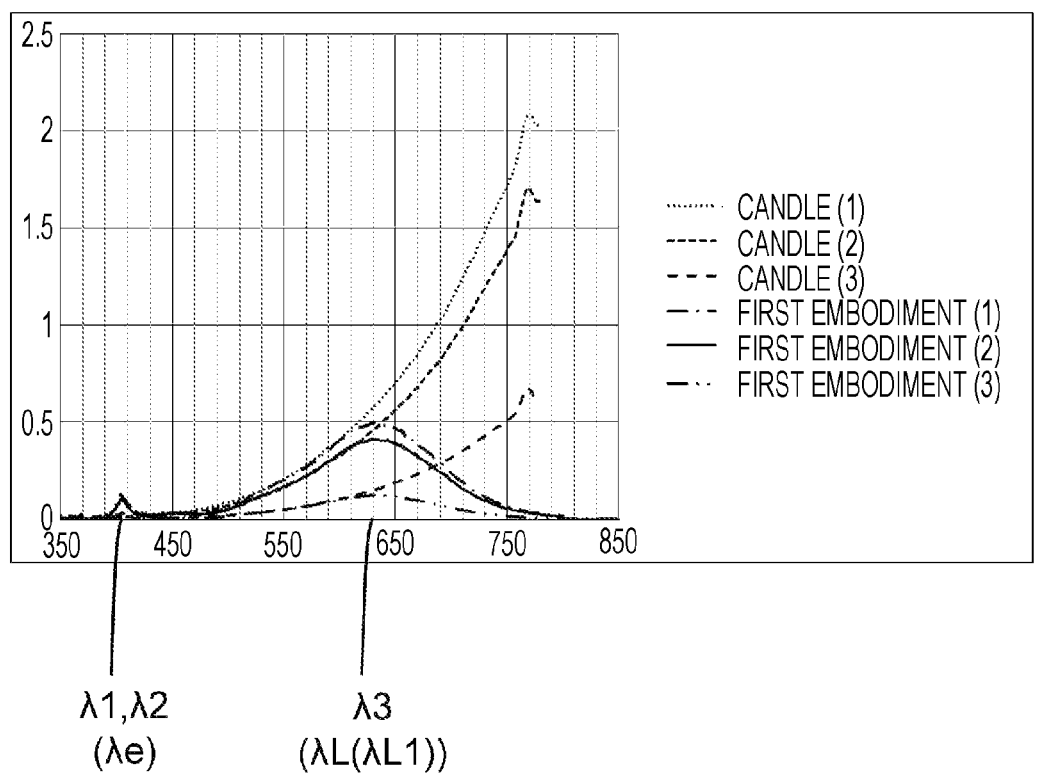
FIG. 6 is a graph showing spectrums of light emitted to the outside from a light-emitting device and/or a lighting device according to an embodiment of the present disclosure.
Figure 7:
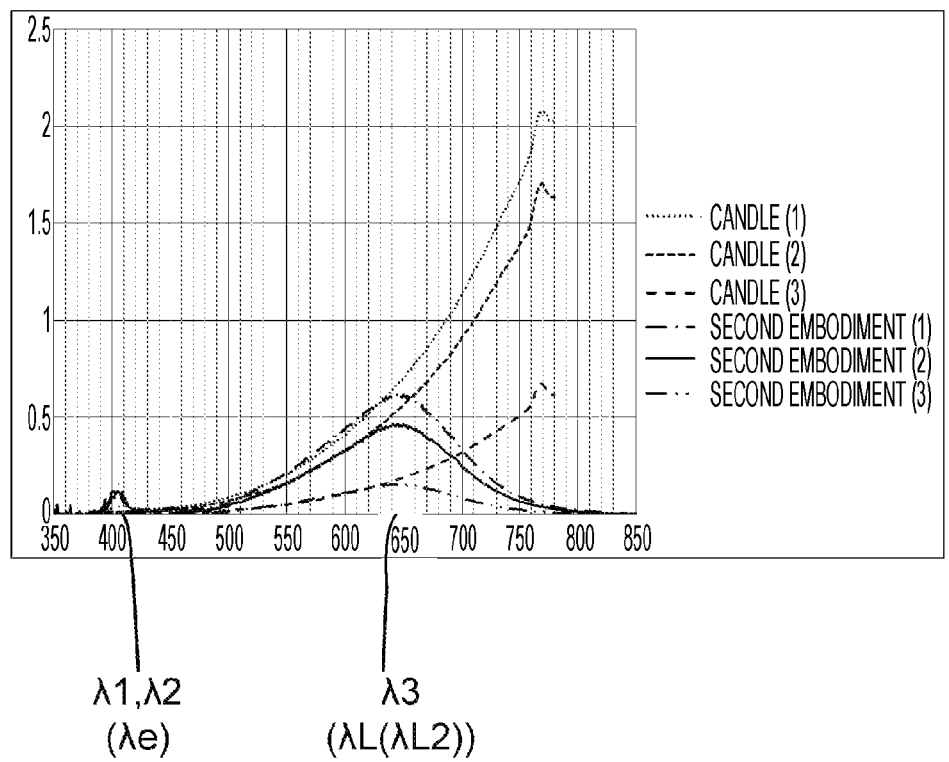
FIG. 7 is a graph showing spectrums of light emitted to the outside from a light-emitting device and/or a lighting device according to an embodiment of the present disclosure.
Figure 8:
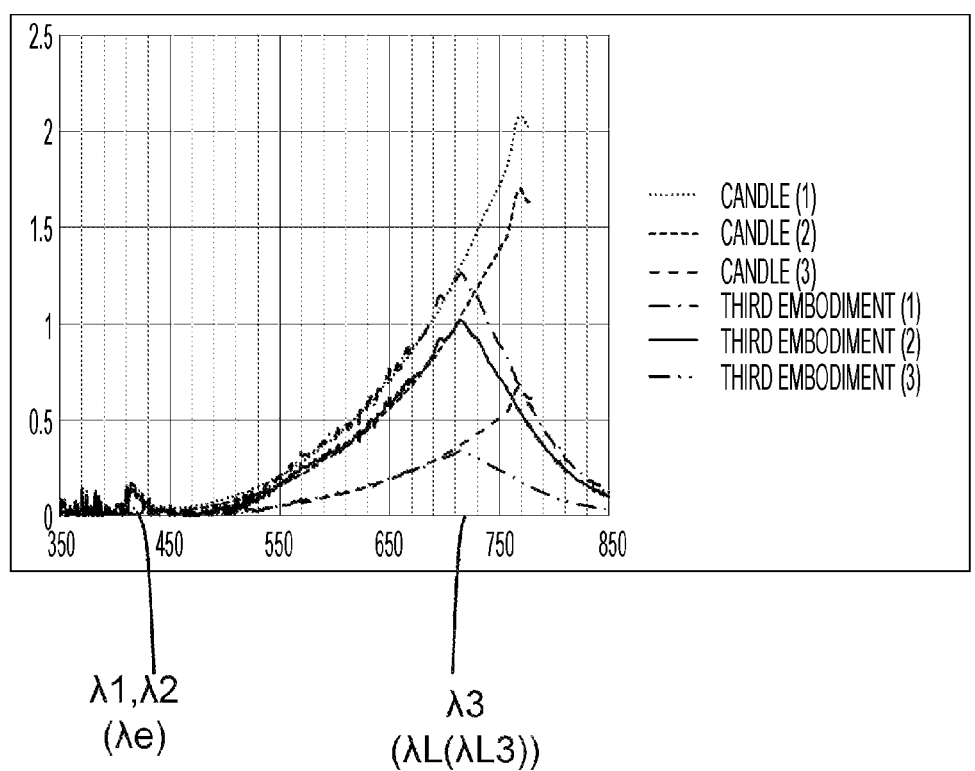
FIG. 8 is a graph showing spectrums of light emitted to the outside from a light-emitting device and/or a lighting device according to an embodiment of the present disclosure.

Referring to FIGS. 6 to 8, the lighting device 10 and the light-emitting devices 1 according to the present disclosure are capable of reproducing light of a Japanese candle (color temperature: 1800 K to 2100 K) as light with a low color temperature. More specifically, one of the second light-emitting devices 1b may have a peak wavelength in a wavelength range from 610 nm to 730 nm. In such a case, the control unit 7 may cause only this second light-emitting device 1b to emit light. The emission spectrum of this second light-emitting device 1b may be such that the relative light intensity is in the range from 0.05 to 0.3 at the peak wavelength and is 0.1 or less in the range from 440 nm to 480 nm.

Alternatively, the control unit 7 may adjust the emission intensities of the second light-emitting devices 1b to reproduce light of a Japanese candle that has a peak wavelength A in the wavelength range from 610 nm to 730 nm and that satisfies the following conditions. The conditions are such that the relative light intensity is in the range from 0.05 to 0.3 at the second peak wavelengths and is 0.1 or less in the range from 440 nm to 480 nm, and such that the light intensity continuously increases in a wavelength range from 480 nm to the peak wavelength A. In this case, the light control ratios of the second light-emitting devices B to E may be set to a low ratio, for example, less than 20%, and the light control ratios of the second light-emitting device F and the second light-emitting device G may be set to a high ratio, for example, 50% or more.

<Lighting Device and Light-Emitting Devices for Reproducing Light of Japanese Candle>

As described above, the lighting device 10 may include the plurality of light-emitting devices 1 including the light-emitting device 1 that reproduces light of a Japanese candle. Alternatively, the light control ratios of the light-emitting devices 1 may be controlled to reproduce light of a Japanese candle. Alternatively, a light-emitting device 1 which itself has an emission spectrum illustrated in FIGS. 6 to 8 may be provided instead of the lighting device 10, and light emitted from the light-emitting device 1 may be used to reproduce light of a Japanese candle.

When the light-emitting device 1 itself reproduces light of a Japanese candle, the light-emitting device 1 includes the light-emitting elements 3 and the wavelength converting member 6. The lighting device 10 or the light-emitting device 1 emits light specified by an emission spectrum having an emission peak wavelength in a wavelength range from 610 nm to 730 nm and an excitation peak wavelength in a wavelength range from 360 nm to 430 nm. Assuming that the light intensity at the emission peak wavelength is 1, the relative light intensity is in the range from 0.05 to 0.3 at the excitation peak wavelength and is 0.1 or less in the range from 440 nm to 480 nm. The light intensity continuously increases in a wavelength range from 480 nm to the emission peak wavelength.

The wavelength converting member 6 may include a plurality of phosphors 60. The phosphors 60 convert light having a peak wavelength (excitation peak wavelength $\lambda e$) in the wavelength range from 360 nm to 430 nm into light having a peak wavelength (emission peak wavelength $\lambda L$) in the wavelength range from 610 nm to 730 nm. The wavelength converting member 6 is disposed at a position such that light emitted from the light-emitting elements 3 can be converted into light having a peak wavelength in the wavelength range from 610 nm to 730 nm. The wavelength range from 610 nm to 730 nm is included in a visible light region.

The phosphors 60 may include a phosphor having a peak wavelength in a wavelength range from 600 nm to 660 nm. The phosphor having a peak wavelength in the wavelength range from 600 nm to 660 nm is, for example, a phosphor that shows a red color. The phosphor that shows a red color may be, for example, $Y_2O_2S:Eu$, $Y_2O_3:Eu$, $SrCaClAlSiN_3:Eu^{2+}$, $CaAlSiN_3:Eu$, or $CaAlSi(ON)_3:Eu$. The phosphor that shows a red color converts light that enters the wavelength converting member 6 into light having a peak wavelength in the wavelength range from 600 nm to 660 nm, and emit the converted light. In addition to the above-described phosphor that shows a red color, the wavelength converting member 6 may also include, for example, a phosphor that shows a color in a near infrared region and that has a peak wavelength in a wavelength range from 680 nm to 800 nm. The phosphor that shows a color in a near infrared region may be, for example, $3Ga_5O_{12}:Cr$. The phosphors 60 having the emission peak wavelength $\lambda L$ in the range from 610 nm to 730 nm may be composed of one of the above-mentioned phosphors or a combination of some of the above-mentioned phosphors.

According to the present disclosure, it is not necessary that phosphors of other colors be included. When phosphors of other colors are not included, red light having the emission peak wavelength $\lambda L$ in the range from 610 nm to 730 nm can be reproduced. In particular, according to the present disclosure, other phosphors are not included, and the relative light intensity is low (0.1 or less) in a blue wavelength range described below. Therefore, compared to a case in which an LED that emits blue light is used, reproducibility of red light having the emission peak wavelength $\lambda L$ in the range from 610 nm to 730 nm can be improved. Small amounts of other phosphors described above that do not affect the emission peak wavelength $\lambda L$ may be included. Light closer to natural light can be obtained when small amounts of phosphors of colors other than red are included.

The peak wavelengths described above and peak wavelengths described below are each a wavelength at which a spectrum has a local maximum value, that is, a wavelength corresponding to a crest between adjacent troughs of the spectrum. The spectrum may have small crests and troughs when light in various colors is emitted by using the phosphors. These small crests and troughs are not used to determine the peak wavelengths. More specifically, for example, a local maximum value in a region between troughs separated from each other by 20 nm or less may not be regarded as a peak.

<Emission Spectrum of Lighting Device and Light-Emitting Device for Reproducing Light of Japanese Candle>

As described above, the lighting device 10 and the light-emitting device 1 according to the present disclosure have an emission spectrum having the excitation peak wavelength $\lambda e$ in the wavelength range from 360 nm to 430 nm and the emission peak wavelength $\lambda L$ in the wavelength range from 610 nm to 730 nm. Assuming that the light intensity at the emission peak wavelength $\lambda L$ is 1, the relative light intensity is in the range from 0.05 to 0.3 at the excitation peak wavelength $\lambda e$ and is 0.1 or less in the range from 440 nm to 480 nm. The light intensity preferably continuously increases in the wavelength range from 480 nm to the emission peak wavelength $\lambda L$. The excitation peak wavelength $\lambda e$ is the wavelength of excitation light of the light-emitting elements 3. When the relative light intensity of the excitation light is in the range from 0.05 to 0.3, even if violet light is directly emitted to the outside as leak light, influence on the color of light to be emitted is small. In addition, a sufficient emission intensity can be maintained. When the relative light intensity is 0.1 or less in the range from 440 nm to 480 nm, the emitted light hardly includes blue light that can be sensed by a human.

Therefore, influence on the color of the emitted light is small, and reproducibility of the desired light is increased. Since the light intensity continuously increases in the wavelength range from 480 nm to the emission peak wavelength $\lambda L$, there are no peak wavelengths in this wavelength range. Therefore, a color corresponding to a wavelength around the emission peak wavelength $\lambda L$ can be appropriately reproduced.

The expression "the light intensity continuously increases in the wavelength range from 480 nm to the emission peak wavelength $\lambda L$" means that, for example, the spectrum has no local maximum values in the wavelength range from 480 nm to the emission peak wavelength λL. As described above, the spectrum may have small crests and troughs, but these small crests and troughs may not be used to determine local maximum values.

Emission spectrums of the lighting device 10 and the light-emitting device 1 according to first to third embodiments of the present disclosure will now be described with reference to FIGS. 6 to 8. The first to third embodiments differ from each other in the materials, amounts, etc., of the phosphors 60 included in the lighting device 10 and the light-emitting device 1. The emission spectrums are measured by, for example, spectroscopy using a spectrophotometer. According to the first to third embodiments, the lighting device 10 and the light-emitting device 1 emit light of a color that simulates the color of candle light. Accordingly, FIGS. 6 to 8 show actually measured values of candle light for comparison and measurement values of the embodiments. More specifically, candle (1) shows the actually measured values of bright, flickering candle light, candle (2) shows the actually measured values of quiet and stable candle light, and candle (3) shows the actually measured values of dark, flickering candle light. In each embodiment, (1) shows the result of reproduction of bright, flickering light, (2) shows the result of reproduction of quiet and stable light, and (3) shows the result of reproduction of dark, flickering light. The emission peak wavelength λL in each embodiment will be referred to as an emission peak wavelength λL1 in the first embodiment, an emission peak wavelength λL2 in the second embodiment, and an emission peak wavelength λL3 in the third embodiment.

First Embodiment

As illustrated in FIG. 6, in the first embodiment, each emission spectrum has the emission peak wavelength λL1 in a wavelength range from 610 nm to 650 nm. In FIG. 6, the emission peak wavelength λL1 is around 630 nm. The emission peak wavelength λL1 corresponds to the wavelength of light emitted by the phosphors 60. When the emission peak wavelength λL1 is in the wavelength range from 610 nm to 650 nm, the phosphors 60 mainly include the above-described phosphor 60 that shows a red color. In this embodiment, the relative light intensity is about 0.26 at the second peak wavelength λ2, and is 0.1 or less in the range from 440 nm to 480 nm. Accordingly, the emitted light hardly includes blue light that can be sensed by a human, so that influence on the color of the emitted light is small and that reproducibility of the desired light is increased. In addition, the light intensity continuously increases in the wavelength range from 480 nm to the emission peak wavelength λL1 (around 630 nm), so that there are no peak wavelengths in this wavelength range. Accordingly, a color corresponding to a wavelength around the emission peak wavelength λL1, that is, in the range from 610 nm to 650 nm, can be reproduced. The lighting device 10 and the light-emitting device 1 according to the first embodiment are capable of emitting bright light of a color that is more clearly red compared to other embodiments.

Second Embodiment

As illustrated in FIG. 7, in the second embodiment, each emission spectrum has the emission peak wavelength λL2 in a wavelength range from 620 nm to 670 nm. In FIG. 7, the emission peak wavelength λL2 is around 645 nm. The emission peak wavelength λL2 corresponds to the wavelength of light emitted by the phosphors 60. When the emission peak wavelength λL2 is in the wavelength range from 620 nm to 670 nm, the phosphors 60 mainly include the above-described phosphor 60 that shows a red color. In this embodiment, the relative light intensity is about 0.25 at the second peak wavelength λ2, and is 0.09 or less in the range from 440 nm to 480 nm. Accordingly, the emitted light hardly includes blue light that can be sensed by a human, so that influence on the color of the emitted light is small and that reproducibility of the desired light is increased. In addition, the light intensity continuously increases in the wavelength range from 480 nm to the emission peak wavelength λL2 (around 645 nm), so that there are no peak wavelengths in this wavelength range. Accordingly, a color corresponding to a wavelength around the emission peak wavelength λL2, that is, in the range from 620 nm to 670 nm, can be reproduced. In particular, the lighting device 10 and the light-emitting device according to the second embodiment are capable of emitting appropriately balanced light that is bright and has a color temperature close to that of candle light.

Third Embodiment

As illustrated in FIG. 8, in the third embodiment, each emission spectrum has the emission peak wavelength λL3 in a wavelength range from 690 nm to 730 nm. In FIG. 8, the emission peak wavelength λL3 is around 715 nm. The emission peak wavelength λL3 corresponds to the wavelength of light emitted by the phosphors 60. When the emission peak wavelength λL3 is in the wavelength range from 690 nm to 730 nm, the phosphors 60 mainly include the above-described phosphor 60 that shows a color in a near infrared region. In this embodiment, the relative light intensity is about 0.06 at the second peak wavelength λ2, and is 0.08 or less in the range from 440 nm to 480 nm. Accordingly, the emitted light hardly includes blue light that can be sensed by a human, so that influence on the color of the emitted light is small and that reproducibility of the desired light is increased. In addition, the light intensity continuously increases in the wavelength range from 480 nm to the emission peak wavelength λL3 (around 715 nm), so that there are no peak wavelengths in this wavelength range. Accordingly, a color corresponding to a wavelength around the emission peak wavelength λL3, that is, in the range from 690 nm to 730 nm, can be reproduced. As illustrated in FIG. 8, the lighting device 10 and the lighting device 10 and the light-emitting device 1 according to the third embodiment are capable of emitting light similar to candle light with the actually measured values, that is, light with high reproducibility.

As described above, since the lighting device 10 and the light-emitting device 1 according to the present disclosure have the above-described configuration, light emitted therefrom has an emission spectrum that hardly includes blue light that can be sensed by a human. Therefore, influence of the blue light on the color of the emitted light is small. In addition, reproducibility of the desired color of light (red) can be increased. When, in particular, candle light at a color temperature of 2000 K is to be reproduced, the light-emitting device 1 according to the second embodiment may be used to reproduce light that is close to candle light in terms of balance between, for example, brightness and reproducibility of the color temperature.

<Color Rendering Property of Lighting Device and Light-Emitting Device>

The color rendering property of the lighting device 10 and the light-emitting device 1 according to the present disclosure will now be described.

The "color rendering property" is an index used to evaluate the quality of a light source, and is quantified by a color rendering index, which shows the appearance of a color with reference to that of natural light. The color rendering index may be, for example, an average color rendering index Ra, a special color rendering index R9, a special color rendering index R10, a special color rendering index R11, a special color rendering index R12, a special color rendering index R13, a special color rendering index R14, or a special color rendering index R15. For example, light sources having the average color rendering index Ra of 100 are sunlight and a light bulb.

According to the lighting device 10 and the light-emitting device 1 of the present disclosure, the light-emitting device 1 having a good color rendering property with the average color rendering index Ra of 85 or more can be realized. For example, the lighting device 10 and the light-emitting device 1 according to the first embodiment have an average color rendering index Ra of 88.0, the lighting device 10 and the light-emitting device 1 according to the second embodiment have an average color rendering index Ra of 88.1, and the lighting device 10 and the light-emitting device 1 according to the third embodiment have an average color rendering index Ra of 88.4.

<Color Temperature of Lighting Device and Light-Emitting Device>

The color temperature is a numerical value that quantifies the color of light emitted from a light source in units of kelvin (K). A low color temperature means that the color of light emitted from the light source is reddish. A high color temperature means that the color of light emitted from the light source is bluish. For example, the color temperature of light emitted from a light bulb is about 2800 K. In addition, for example, the color temperature of white daylight is about 4200 K.

Light defined by the emission spectrum of the lighting device and the light-emitting device 1 according to the first embodiment has a color temperature of 2083 K. Light defined by the emission spectrum of the lighting device 10 and the light-emitting device 1 according to the second embodiment has a color temperature of 1964 K. Light defined by the emission spectrum of the lighting device 10 and the light-emitting device 1 according to the third embodiment has a color temperature of 1825 K.

According to the first to third embodiments, the lighting device 10 and the light-emitting device 1 emit light with an emission spectrum of around 2000 K in the range from 1800 K to 2100 K when measurement differences are included. Thus, a red color similar to that of warm Japanese candle light can be reproduced.

When the lighting device 10 includes at least one light-emitting device 1 that reproduces Japanese candle light, the lighting device 10 may include the control unit 7 that adjusts the light intensity (light control ratio) for the light-emitting device 1 as in the above-described configuration. The control unit 7 is capable of controlling the intensity of light emitted from the light-emitting device 1 by adjusting the current applied to the light-emitting device 1. The control unit 7 is capable of making an adjustment so that the light emitted from the light-emitting device 1 appears to flicker by temporally or randomly changing the light control ratio. The control unit 7 may be attached to a wiring board 12.

Alternatively, the lighting device 10 may have a reception unit, and the control unit 7 may be configured to issue a command to a portion of, for example, the wiring board 12 that controls the current through wireless communication from the outside.

When the lighting device 10 includes the control unit 7 capable of performing light control as described above, light with a constant color temperature and a varying intensity (brightness) can be reproduced.

<Example of Use of Lighting Device>

The lighting device 10 according to the present disclosure is capable of reproducing light of a candle (Japanese candle). For example, the lighting device 10 may be used to illuminate, for example, a column of a temple, a Japanese panting, or a wall surface to present colors as viewed in candle light. In addition, flickering of candle light can be reproduced by adjusting the light intensity.

The lighting device 10 may be used not only in an indoor space, such as a space in a building or a house, but also in an outdoor space.

<Structure of Lighting Device>

Figure 9:
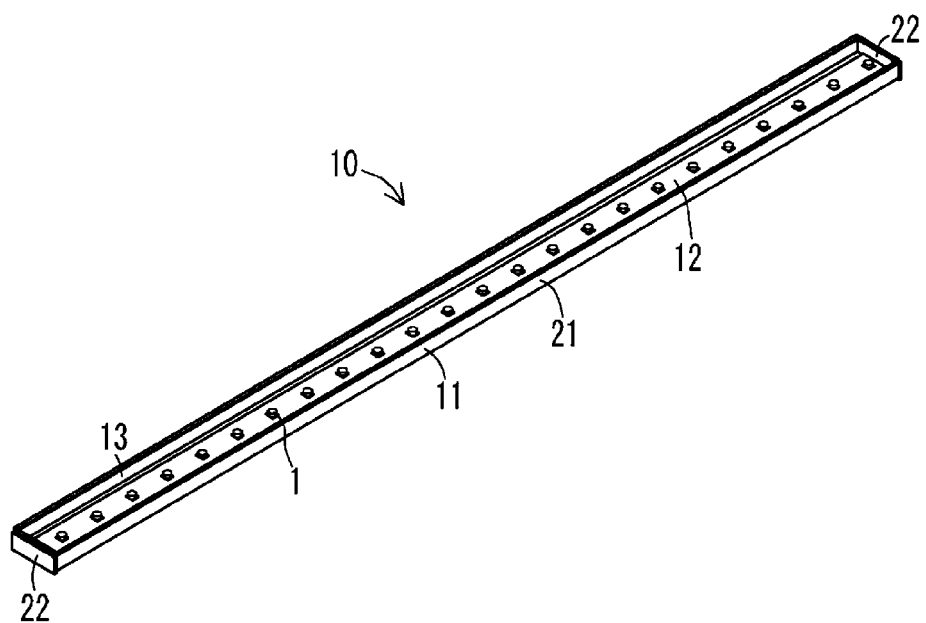
FIG. 9 is an external perspective view of the lighting device including the light-emitting devices according to the embodiment of the present disclosure.
Figure 10:
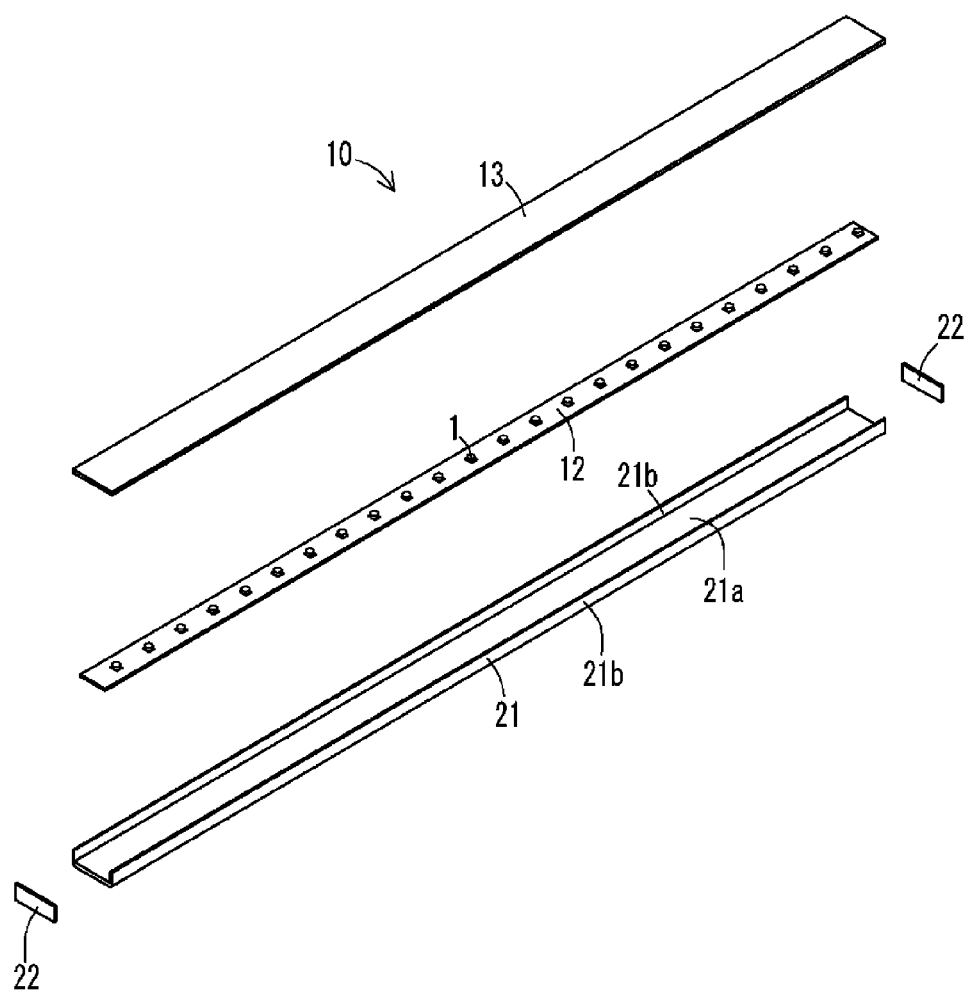
FIG. 10 is an exploded perspective view of the lighting device according to the embodiment of the present disclosure.
Figure 11:
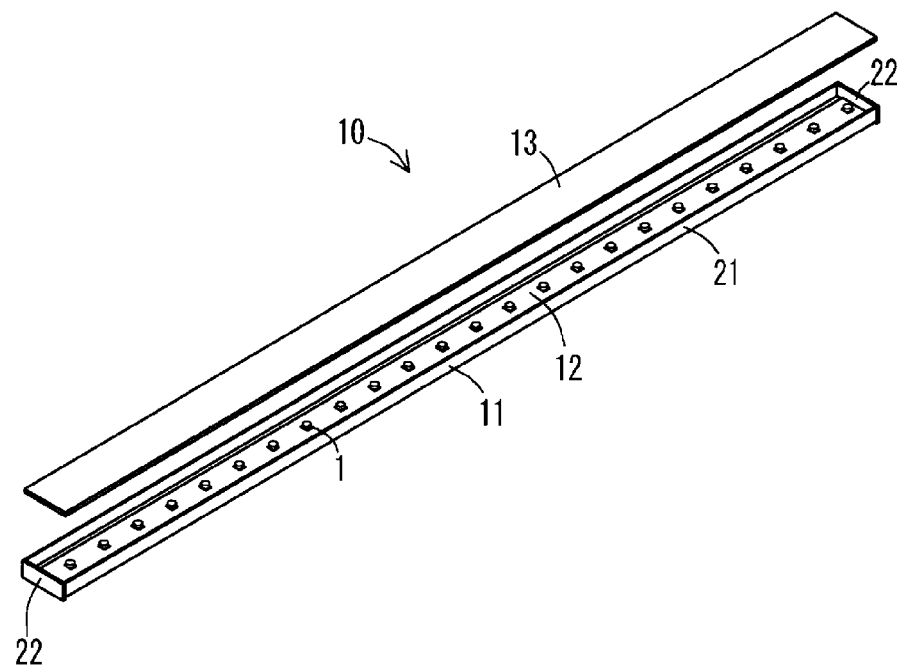
FIG. 11 is a perspective view of the lighting device according to the embodiment of the present disclosure in which a light transmissive substrate is removed from a housing.

Referring to FIGS. 9 to 11, the lighting device 10 includes an elongated housing 11 that is open at the top, a plurality of the light-emitting devices 1 arranged in the housing 11 along a line extending in a longitudinal direction, an elongated wiring board 12 on which the light-emitting devices 1 are mounted, and an elongated light transmissive substrate 13 that is supported by the housing 11 and covers the opening of the housing 11.

The housing 11 has a function of holding the light transmissive substrate 13 and a function of dissipating heat generated by the light-emitting devices 1 to the outside. The housing 11 is made of, for example, a metal, such as aluminum, copper, or stainless steel, plastic, or resin. The housing 11 includes a bottom portion 21a that extends in the longitudinal direction and portions that extend upward from end portions of the bottom portion 21a in the width direction. The housing 11 is composed of an elongated main portion 21 and two cover portions 22. The main portion 21 includes a pair of support portions 21b extending in the longitudinal direction, and is open at the top and both ends thereof in the longitudinal direction. The cover portions 22 cover the openings at one and the other ends of the main portion 21 in the longitudinal direction. The surfaces of the support portions 21b that face the interior space of the housing 11 are provided with holding portions in upper regions thereof. The holding portions have recesses that used to hold the light transmissive substrate 13 and formed so as to face each other and extend in the longitudinal direction. The length of the housing 11 in the longitudinal direction is, for example, 100 mm or more and 2000 mm or less.

The wiring board 12 is fixed to an inner bottom surface of the housing 11. The wiring board 12 may be, for example, a printed substrate composed of a rigid substrate, a flexible substrate, or a rigid flexible substrate. A wiring pattern on the wiring board 12 and a wiring pattern on the substrate 2 of each light-emitting device 1 are electrically connected to each other with solder or a conductive adhesive. A signal from the wiring board 12 is transmitted to the light-emitting elements 3 through the substrate 2, and the light-emitting elements 3 emit light. The wiring board 12 receives electric power from an external power supply through wires.

The light transmissive substrate 13 is made of a material that transmits light emitted from the light-emitting devices 1. The material is, for example, a light-transmitting material, such as an acrylic resin or glass. The light transmissive substrate 13 is a rectangular plate having a length of, for example, 98 mm or more and 1998 mm or less in the longitudinal direction. The light transmissive substrate 13 is inserted into the above-described recesses formed in the support portions 21b from the opening at one or the other end of the main portion 21 in the longitudinal direction. Then, the light transmissive substrate 13 is slid in the longitudinal direction, and is thereby supported by the pair of support portions 21b at a position spaced from the plurality of light-emitting devices 1. Then, the openings at one and the other ends of the main portion 21 in the longitudinal direction are covered with the cover portions 22, so that the lighting device 10 is obtained.

The above-described lighting device 10 is a linear-emission lighting device in which the light-emitting devices 1 are arranged along a straight line. However, the lighting device 10 is not limited to this, and may instead be a planar-emission lighting device in which the light-emitting devices 1 are arranged in a matrix pattern or a staggered pattern.

In each of the second light-emitting devices 1b included in the lighting device 10 according to the embodiment of the present disclosure, the phosphors contained in one wavelength converting member 6 may include one or more of the five types of phosphors, which are the phosphor that emits blue fluorescent light, the phosphor that emits blue-green fluorescent light, the phosphor that emits green fluorescent light, the phosphor that emits red fluorescent light, and the phosphor that emits near infrared fluorescent light, as described above. However, the second light-emitting devices 1b are not limited to this, and may each include two types of wavelength converting members. When two types of wavelength converting members are provided, the wavelength converting members may include a first wavelength converting member and a second wavelength converting member in which different phosphors or phosphors in different combinations are dispersed. These two wavelength converting members may be provided in one light-emitting device, and light rays transmitted through the wavelength converting members may be mixed. In such a case, the color rendering property of the emitted light can be easily controlled.

The present disclosure is not limited to the examples of the above-described embodiments, and various modifications, including those of numerical values, are possible. Combinations of characteristic features of the embodiments are not limited to those in the examples of the above-described embodiments.

REFERENCE SIGNS LIST 1 light-emitting device
1a first light-emitting device
1b second light-emitting device
10 lighting device
11 housing
12 wiring board
13 light transmissive substrate
2 substrate
21 main portion
21a bottom portion
21b support portion
22 cover portion
3 light-emitting element
4 frame
5 sealing member
6 wavelength converting member
60 phosphor
7 control unit $\lambda_1$ first peak wavelength
$\lambda_2$ second peak wavelength
$\lambda_3$ third peak wavelength
$\lambda_e$ excitation peak wavelength
$\lambda_L$ emission peak wavelength

The invention claimed is:

1. A lighting device comprising:
a first light-emitting device;
a plurality of second light-emitting devices; and
a control unit,
wherein the first light-emitting device has a first emission spectrum that has a first peak wavelength in a wavelength range from 360 nm to 430 nm and in which a light intensity continuously decreases with decreasing wavelength from the first peak wavelength,
wherein each of the plurality of second light-emitting devices has a second emission spectrum that has a second peak wavelength in the wavelength range from 360 nm to 430 nm, that has a third peak wavelength in a wavelength range from the second peak wavelength to 750 nm, and in which a light intensity continuously decreases with decreasing wavelength from the second peak wavelength and with increasing wavelength from the third peak wavelength,
wherein the control unit controls the first light-emitting device and the plurality of second light-emitting devices,
wherein the third peak wavelengths of the plurality of second light-emitting devices differ from each other,
wherein the first peak wavelength is equal to at least one of the second peak wavelengths, and
wherein the second peak wavelength of each of the plurality of second light-emitting devices are equal.

2. The lighting device according to claim 1, wherein the control unit selects a light-emitting device to be caused to emit light from the first light-emitting device and the plurality of second light-emitting devices.

3. The lighting device according to claim 2, wherein the first peak wavelength and the second peak wavelengths are wavelengths of excitation light and the third peak wavelengths are wavelengths of fluorescent light, and
wherein the control unit selects the first light-emitting device as the light-emitting device to be caused to emit light and controls which of the plurality of second light-emitting devices is to be caused to emit light based on the first emission spectrum.

4. The lighting device according to claim 1, wherein the control unit controls a light control ratio for each of the first light-emitting device and the plurality of second light-emitting devices.

5. The lighting device according to claim 4, wherein the first peak wavelength and the second peak wavelengths are wavelengths of excitation light and the third peak wavelengths are wavelengths of fluorescent light, and
wherein the control unit sets a first light control ratio for the first light-emitting device and controls a light control ratio for each of the plurality of second light-emitting devices based on the first light control ratio.

6. The lighting device according to claim 1, wherein the control unit selects a light-emitting device that serves as a reference for controlling a light control ratio from the first light-emitting device and the plurality of second light-emitting devices, and controls a light control ratio for each light-emitting device based on a light control ratio for the light-emitting device that serves as the reference.

7. The lighting device according to claim 1, wherein the control unit sets a second light control ratio for one of the plurality of second light-emitting devices that has a peak wavelength corresponding to a maximum light intensity in the wavelength range from the second peak wavelength to 750 nm, and controls a light control ratio for each of the first light-emitting device and other ones of the plurality of second light-emitting devices based on the second light control ratio.

8. The lighting device according to claim 1, wherein the third peak wavelengths of the plurality of second light-emitting devices have a half-width that increases with increasing wavelength.

9. The lighting device according to claim 1, wherein the third peak wavelengths of the plurality of second light-emitting devices differ from each other by at least 10 nm or more.

10. The lighting device according to claim 1, wherein when a light control ratio for the first light-emitting device is equal to a light control ratio for at least one of the plurality of second light-emitting devices, a light intensity at the second peak wavelength of the second light-emitting device controlled at the light control ratio equal to the light control ratio for the first light-emitting device is 25% or less of a light intensity at the first peak wavelength.

11. The lighting device according to claim 1, wherein the control unit selects, from the plurality of second light-emitting devices, the second light-emitting devices having the third peak wavelengths with a small overlap in a wavelength range from the second peak wavelengths to 750 nm.

12. The lighting device according to claim 1, wherein the control unit selects, from the plurality of second light-emitting devices, the second light-emitting devices having the third peak wavelengths that overlap in a wavelength range from the second peak wavelengths to 750 nm.

13. The lighting device according to claim 1, wherein half-widths at the second peak wavelengths of the plurality of second light-emitting devices are equal.

14. The lighting device according to claim 1, wherein at least one of the plurality of second light-emitting devices has the second emission spectrum that has a peak wavelength A in a wavelength range from 610 nm to 730 nm as the third peak wavelength and in which, assuming that a light intensity at the peak wavelength A is 1, a relative light intensity is in a range from 0.05 to 0.3 at the second peak wavelength and is 0.1 or less in a range from 440 nm to 480 nm, and the light intensity continuously increases in a wavelength range from 480 nm to the peak wavelength A.

15. A lighting device having an emission spectrum having an excitation peak wavelength in a wavelength range from 360 nm to 430 nm and an emission peak wavelength in a wavelength range from 610 nm to 730 nm,
  wherein on a condition that a light intensity at the emission peak wavelength is 1, a relative light intensity is in a range from 0.05 to 0.3 at the excitation peak wavelength and is 0.1 or less in a range from 440 nm to 480 nm, and the light intensity continuously increases in a wavelength range from 480 nm to the emission peak wavelength, and
  wherein light defined by the emission spectrum has a color temperature in a range from 1800 K to 2100 K.

16. The lighting device according to claim 15, comprising:
  a light-emitting element that emits light having the excitation peak wavelength; and
  at least one phosphor that converts the light emitted by the light-emitting element into light having the emission peak wavelength.

17. The lighting device according to claim 15, wherein light defined by the emission spectrum has an average color rendering index Ra of 85 or more.

* * * * *